(12) United States Patent
Rudeck et al.

(10) Patent No.: US 8,304,322 B2
(45) Date of Patent: Nov. 6, 2012

(54) METHODS OF FILLING ISOLATION TRENCHES FOR SEMICONDUCTOR DEVICES AND RESULTING STRUCTURES

(75) Inventors: Paul J. Rudeck, Hillsboro, OR (US); Sukesh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 861 days.

(21) Appl. No.: 11/405,629

(22) Filed: Apr. 18, 2006

(65) Prior Publication Data
US 2007/0243692 A1    Oct. 18, 2007

(51) Int. Cl.
*H01L 21/76* (2006.01)
(52) U.S. Cl. ........................ 438/431; 430/424
(58) Field of Classification Search .................. 438/424, 438/431, 432, 437, 430; 257/E21.545
See application file for complete search history.

(56) References Cited

U.S. PATENT DOCUMENTS

| | | | | |
|---|---|---|---|---|
| 6,110,800 A | * | 8/2000 | Chou | 438/431 |
| 6,316,331 B1 | * | 11/2001 | Tseng | 438/431 |
| 6,391,784 B1 | * | 5/2002 | Ibok | 438/702 |
| 7,271,074 B2 | * | 9/2007 | Lerner et al. | 438/435 |
| 2002/0127818 A1 | * | 9/2002 | Lee et al. | 438/424 |
| 2006/0220142 A1 | * | 10/2006 | Tamura | 257/374 |
| 2007/0224772 A1 | * | 9/2007 | Hall et al. | 438/400 |

* cited by examiner

*Primary Examiner* — Bradley K Smith
(74) *Attorney, Agent, or Firm* — Dickstein Shapiro LLP

(57) ABSTRACT

The invention relates to a method and resulting structure that can substantially minimize and/or eliminate void formation during an isolation trench isolation fill process for typical trench shaped and goal-post shaped isolation regions. First, a thin thermal oxidation layer is grown on the sidewall of each trench and then a layer of polysilicon is deposited above the oxidation layer and oxidized. In one embodiment, a repeating series of polysilicon deposition and polysilicon oxidation steps are performed until each trench has been completely filled. In another embodiment, within a goal-post shaped trench having a wider upper portion and a narrower lower portion, the remainder of the upper wider trench portion is filled using a conventional high density plasma technique.

13 Claims, 11 Drawing Sheets

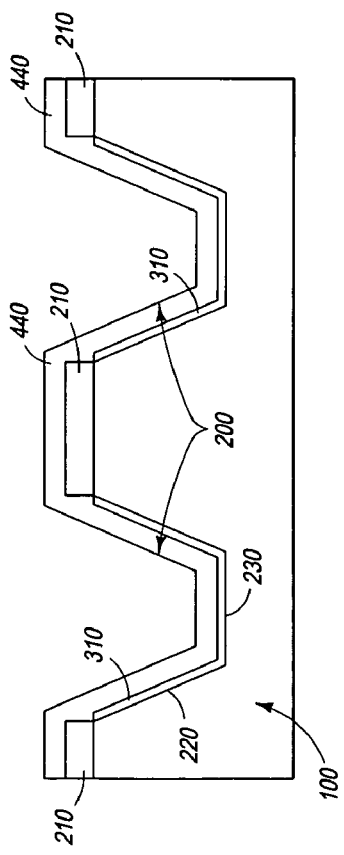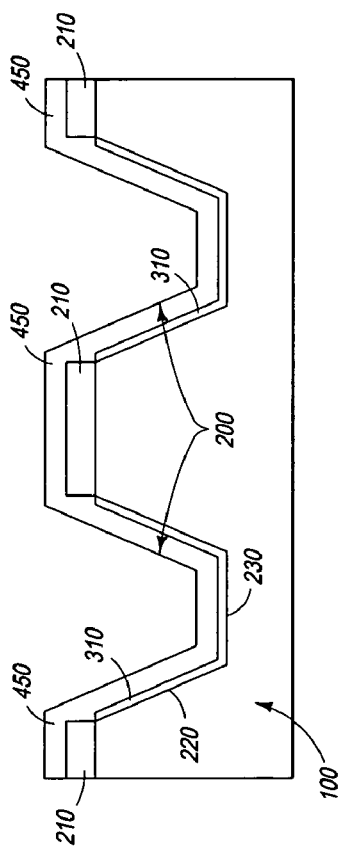

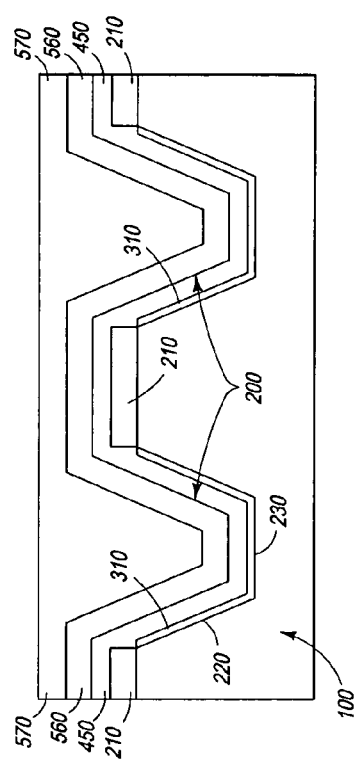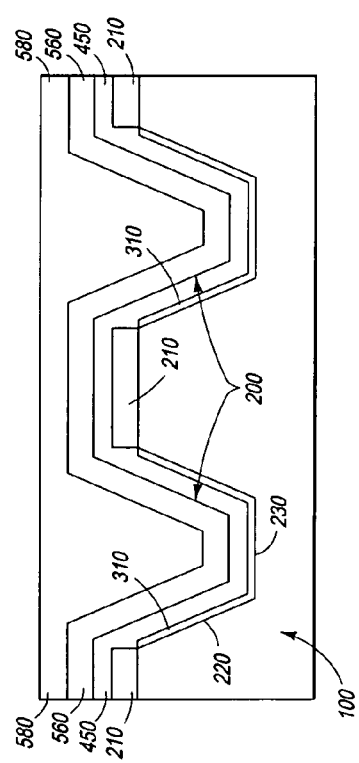

METHODS OF FILLING ISOLATION TRENCHES FOR SEMICONDUCTOR DEVICES AND RESULTING STRUCTURES

FIELD OF THE INVENTION

The present invention relates to the field of semiconductor devices and, in particular, to methods for filling high aspect ratio trench isolation regions in semiconductor devices and the resulting structures.

BACKGROUND OF THE INVENTION

Typically in semiconductor device applications, numerous devices are packed into a small area of a semiconductor substrate to create an integrated circuit. Generally, these devices need to be electrically isolated from one another to avoid problems among the devices. Accordingly, electrical isolation is an important part of semiconductor device design to prevent unwanted electrical coupling between adjacent components and devices. This is particularly true for high density memory, including but not limited to, flash memory.

Shallow trench isolation (STI) is one known conventional isolation method and provides very good device-to-device isolation. An STI process generally includes the following steps. First, a trench is formed in a semiconductor substrate using wet or dry etching with a mask. Then, an insulating layer is deposited on the entire surface of the semiconductor substrate to fill the trench. Finally, chemical mechanical polishing (CMP) is used to planarize the insulating layer. The insulating layer remaining in the trench acts as an STI region for providing isolation among devices in the substrate. Additionally, a nitride or oxidation layer may be formed on the sidewalls and bottom of the trench before depositing the insulating layer.

As semiconductor devices get smaller and more complex, and as packing density increases, the width of the STI regions also decreases. In addition, for certain types of electronic devices, a deeper isolation trench is desired. When filling an isolation trench with a high-density plasma oxide having good filling capability, voids or seams may exist in the isolation regions. This void formation problem occurs in the formation of traditional isolation trenches as well as the so called goal-post type shaped trenches. These void defects cause electrical isolation between the devices to be reduced. Poor isolation can lead to such problems as short circuits and can further reduce the lifetime of one or more circuits formed on a substrate.

FIGS. 1A and 1B illustrate isolation trenches 11 formed in a semiconductor substrate 10 in accordance with the prior art. Before forming the isolation trenches 11, other layers may be blanket deposited over the semiconductor substrate 10; for example, FIGS. 1A & 1B illustrate layers later used to form gate structures, including an oxide layer 12, a polysilicon layer 14, and a nitride layer 16. After the trenches 11 are formed through layers 12, 14, 16 and into substrate 10, an insulating layer 20 is deposited over the layers 12, 14, 16 and semiconductor substrate 10 to fill the trenches 11. The insulating layer 20 can be deposited using high density plasma (HDP) or high-density plasma chemical vapor deposition (HPDCVD) techniques. Due to the shape of the trenches 11, the HDP or HPDCVD process tends to leave void regions 22 or seams 24 in the insulating layer 20, as shown in FIGS. 1A and 1B, respectively.

Voids 22 occur because the insulating layer 20 deposited on the sidewalls at the top of a trench 11 grows thicker than the portion closer to the bottom of the trench 11. Therefore, the opening at the top of the trench 11 becomes closed-off before the entire volume of the trench 11 can be filled causing the formation of the void region 22. The void region 22 diminishes the isolation properties of the filled trench 11. Moreover, the filling material, typically an oxide, tends to be non-conformal and thus, fails to conform to the profile of the surface ideally.

Seams 24 occur where the opposing faces of the inward growing insulating layer 20 within a trench 11 are joined together. While seam 24, in and of itself, does no harm in the structure, if the structure of FIG. 1B is exposed to etching steps during subsequent processing, the portion of insulating layer 20 adjacent seam 24 may be more sensitive to etching than the rest of material 20, which will reduce the isolation properties of the filled trench 11 in a similar manner to that of void 22.

Another problem with voids 22 and seams 24 are that they can be exposed during subsequent process steps and either trap contamination, and/or cause surface roughness. Consequently, films deposited after the roughness (voids 22 and seams 24) has been exposed will not form a consistent, flat layer, but will instead follow the contours of the void or seam below. The inconsistent, resulting film can lead to subsequent breaks in the film. These breaks, if patterned and etched later, will make it increasingly hard to remove the resulting film layer from the void, and thus can electrically short together two areas that are intended to be isolated.

Accordingly, there is a need and desire for a method of filling trench isolation regions that achieves high quality isolation, but also reduces the formation of voids and seams in the insulating material. An improved trench isolation region is also desired.

BRIEF SUMMARY OF THE INVENTION

The invention relates to a method and resulting structure that can substantially minimize and/or eliminate void formation during the shallow trench isolation fill process for typical trench shaped and goal-post shaped isolation regions. First, a thin thermal oxidation layer is grown on the sidewall of each trench and then a layer of polysilicon is deposited above the oxidation layer. In one embodiment, a repeating series of polysilicon deposition and polysilicon oxidation steps are performed until each trench has been completely filled. In another embodiment, within a goal-post shaped trench, the remainder of the wide trench is filled using a conventional high density plasma technique.

BRIEF DESCRIPTION OF THE DRAWINGS

The above described features of the invention will be more clearly understood from the following detailed description, which is provided with reference to the accompanying drawings in which:

FIG. 4 shows a cross-sectional view of the semiconductor device at a fabrication stage subsequent to FIG. 3;

FIG. 5 shows a cross-sectional view of the semiconductor device at a fabrication stage subsequent to FIG. 4;

FIG. 8 shows a cross-sectional view of the semiconductor device at a fabrication stage subsequent to FIG. 7;

FIG. 9 shows a cross-sectional view of the semiconductor device at a fabrication stage subsequent to FIG. 8;

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order The term "substrate" is to be understood as including all forms of semiconductor wafers and substrates including silicon, silicon-on-insulator (SOI), silicon-on-sapphire (SOS), doped and undoped semiconductors, epitaxial layers of silicon supported by a base semiconductor structures. Furthermore, when reference is made to a "substrate" in the following description, previous process steps may have been utilized to form regions or junctions in or above the base semiconductor structure or foundation. In addition, the semiconductor need not be silicon-based, but could be based on other semiconductors, for example, silicon-germanium, germanium or gallium arsenide.

The present invention relates to methods for filling trench isolation regions that allow for better gap-fill characteristics while substantially mitigating the presence of voids and seams. The invention may be used in any integrated circuit high packing density environment, including but not limited to memory array, flash memory array being just one example.

Figure 1A:
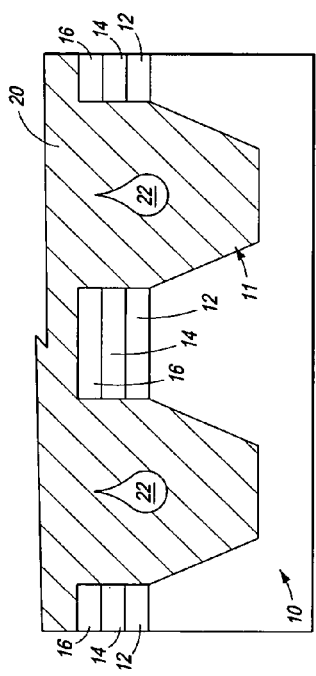
FIG. 1A depicts a prior art semiconductor substrate including isolation trenches including voids.
Figure 1B:
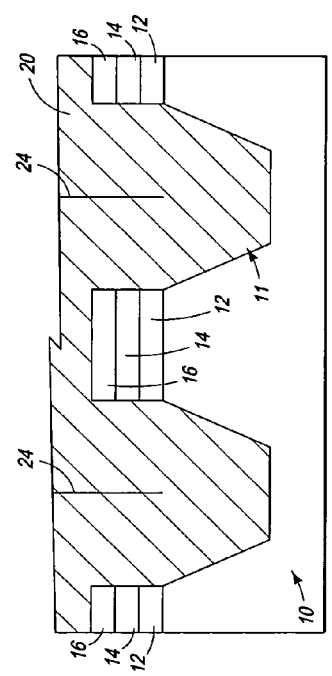
FIG. 1B depicts a prior art semiconductor substrate including isolation trenches including seams.
Figure 2:
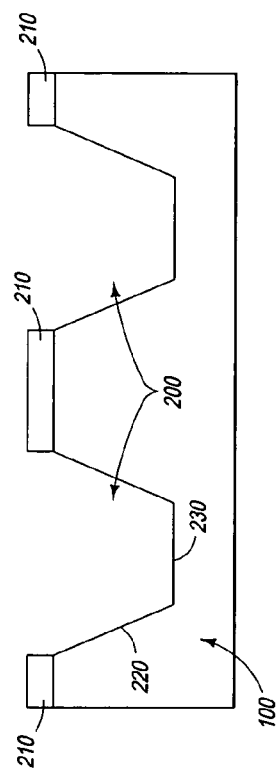
FIG. 2 is a cross-sectional view of a semiconductor device with isolation trenches formed in a semiconductor substrate during an early fabrication stage in accordance with an exemplary embodiment of the invention.

FIG. 2 depicts unfilled isolation trenches 200 to be used as isolation regions in a semiconductor substrate 100. Before forming the trenches 200, a nitride layer 210 may be blanket deposited over the semiconductor substrate 100 as a part of the later fabrication of devices in and over substrate 100. In some instances, it may be desired to deposit an oxide layer and a polysilicon layer over the semiconductor substrate. For purposes of description of the embodiments of this invention, the embodiments are described as having a nitride layer 210 deposited over the semiconductor substrate 100. The isolation trenches 200 are formed by any method known in the art that is suitable for forming an isolation trench 200. The trenches 200 comprise sidewalls 220 that terminate at a bottom 230.

Figure 3:
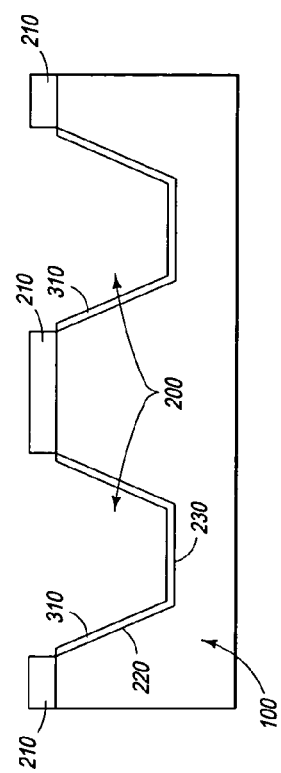
FIG. 3 shows a cross-sectional view of the semiconductor device at a fabrication stage subsequent to FIG. 2.

Referring to FIG. 3, a thermal oxide layer 310 is formed/grown on the sidewalls 220 and bottom 230 of the isolation trenches 200. It should be appreciated that the growth of oxide layer 310 stops below the nitride layer 210. It should also be appreciated that when the oxide layer 260 and the polysilicon layer 250 are deposited over the semiconductor substrate 100, the oxide layer 310 is formed/grown on the sidewalls of these layers as well. Although oxide layer 310 has been described as formed using a thermal oxidation process, it should be appreciated that the oxide layer could be formed by deposition, if desired.

Next, referring to FIG. 4, a layer of polysilicon 440 is deposited on the thermal oxide layer 310. The polysilicon layer 440 extends above the substrate 100 and additionally covers the nitride layer 210. Referring to FIG. 5, the polysilicon layer 440 is oxidized, thus converting the polysilicon layer 440 into a pure silicon dioxide layer 450.

Figure 6:
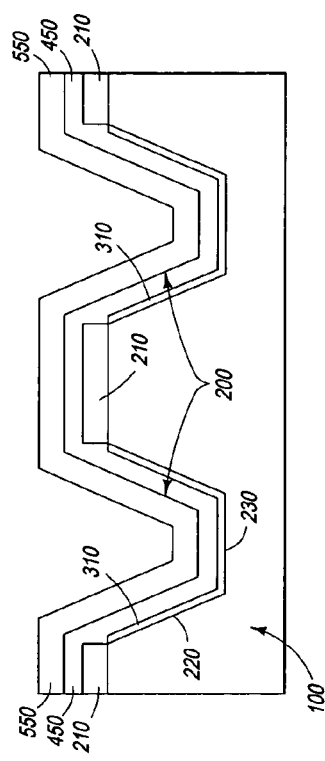
FIG. 6 shows a cross-sectional view of the semiconductor device at a fabrication stage subsequent to FIG. 5.
Figure 7:
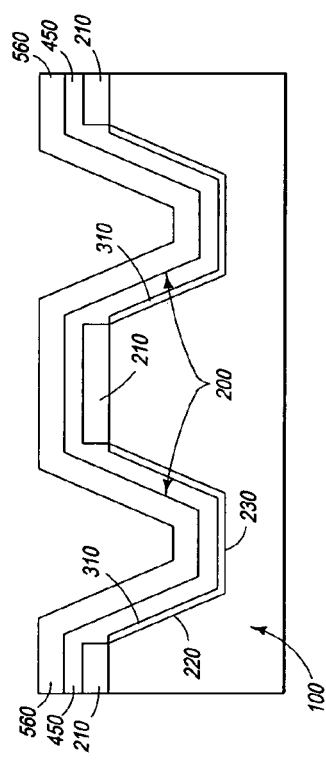
FIG. 7 shows a cross-sectional view of the semiconductor device at a fabrication stage subsequent to FIG. 6.

Referring to FIG. 6, another layer of polysilicon 550 is deposited above the silicon dioxide layer 450. The layer of polysilicon 550 is oxidized to convert the polysilicon into a pure silicon dioxide layer 560 (i.e., a dielectric), as shown in FIG. 7. The steps of FIGS. 6 and 7 are repeated until each trench 200 is completely filled. Accordingly, referring to FIGS. 8 and 9, a third layer of polysilicon 570 can be deposited and oxidized into a layer of silicon dioxide 580. The illustrated embodiment uses three layers of polysilicon to fill the trenches 200. It should be appreciated, however, that the invention is not limited to using three layers. The described method can be used with any number of deposited layers to form void free trench isolation regions.

Figure 10:
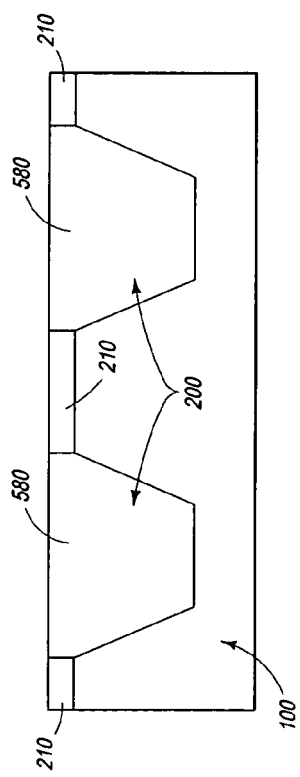
FIG. 10 shows a cross-sectional view of the semiconductor device at a fabrication stage subsequent to FIG. 9.
Figure 11:
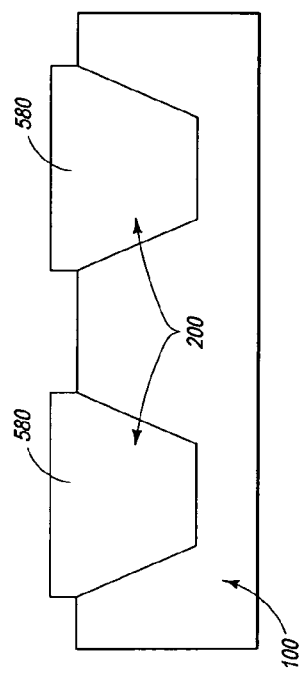
FIG. 11 shows a cross-sectional view of the semiconductor device at a fabrication stage subsequent to FIG. 10.

Referring to FIG. 10, once the trenches 200 are filled, the trenches 200 are subsequently planarized. This can be done by chemical mechanical polishing or by any other method known in the art. The final step, shown in FIG. 11, is removing the nitride layer 210 from the substrate 100 surface by etching. It should be appreciated that any etching method known in the art can be used.

The invention solves the void formation problems associated with the prior art oxide deposition methods. The invention has the ability to use two beneficial materials to fill the trench structures. Polysilicon is very conformal and does not form voids when deposited. Silicon dioxide is known to be a good material for electrical isolation. The present invention combines the best properties from both materials and, as described above, first deposits polysilicon for its conformal properties and then oxidizes it into silicon dioxide to enhance or form good dielectric properties.

In another exemplary embodiment, the process can be modified and applied to goal-post shaped trenches as explained below.

Figure 12:
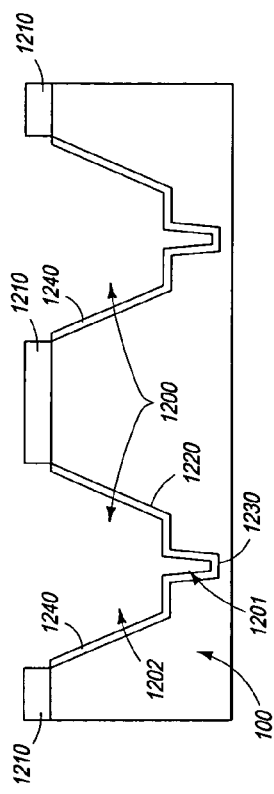
FIG. 12 shows a cross-sectional view of the semiconductor device at an early fabrication stage in accordance with a second exemplary embodiment of the invention.

FIG. 12 depicts unfilled goal-post shaped isolation trenches 1200 to be used as isolation regions in a semiconductor substrate 100. Before forming the trenches 1200, a nitride layer 1210 may be blanket deposited over the semiconductor substrate 100 as a part of the subsequent fabrication of devices in and over substrate 100. The illustrated embodiment is described as having a nitride layer 1210 deposited over the semiconductor substrate 100. However, it should be appreciated that any or all of the layers described can be blanket deposited over the substrate 100. The isolation trenches 1200 are formed by any etching method known in the art that is suitable for forming an isolation trench 1200. The goal-post shaped isolation trenches 1200 in essence comprise two respective trench portions 1201, 1202, with trench portion 1201 being narrower and formed at a bottom 1230 of trench portion 1202, which is a much wider. Additionally, trench portions 1201, 1202 comprise sidewalls 1220 that terminate at a trench bottom 1230.

Referring to FIG. 12, a thermal oxide layer 1240 is formed/grown on the sidewalls 1220 and bottom 1230 of the isolation trench portions 1201, 1202. It should be appreciated that the growth of oxide layer 1240 stops below the nitride layer 1210. Although oxide layer 1240 has been described as being formed using a thermal oxidation process, it should be appreciated that the oxide layer 1240 could be formed by deposition, if desired.

Figure 13:
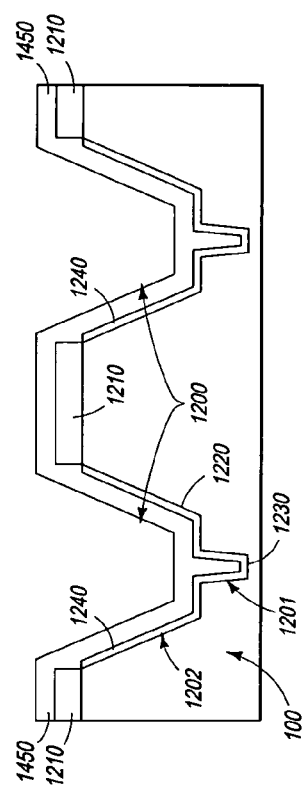
FIG. 13 shows a cross-sectional view of a semiconductor device at a fabrication stage subsequent to FIG. 12.
Figure 14:
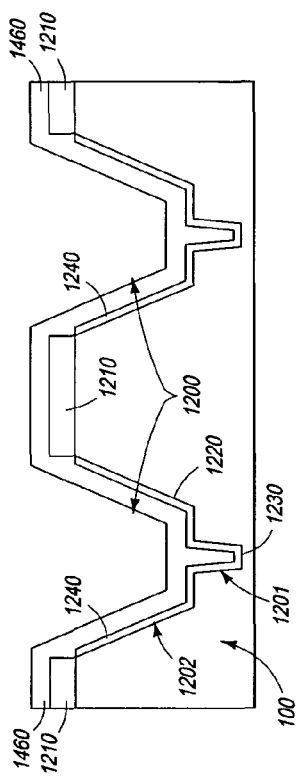
FIG. 14 shows a cross-sectional view of a semiconductor device at a fabrication stage subsequent to FIG. 13.

Next, referring to FIG. 13, a layer of polysilicon 1450 is deposited above the thermal oxide layer 1240 along the sidewalls of trench portion 1202 and along the sidewalls of trench portion 1201. The polysilicon layer 1450 extends above the substrate 100 and additionally covers the nitride layer 1210. Referring to FIG. 14, the polysilicon layer 1450 (FIG. 13) is oxidized and converted into a pure silicon dioxide layer 1460. It should be appreciated that the thickness of the polysilicon layer 1450 (FIG. 13) should be based on the width of the narrow trench portion 1201. The thickness of the polysilicon layer 1450 (FIG. 13) should be sufficient so that the narrow trench portion 1201 is completely filled after the oxidation of the polysilicon.

Figure 15:
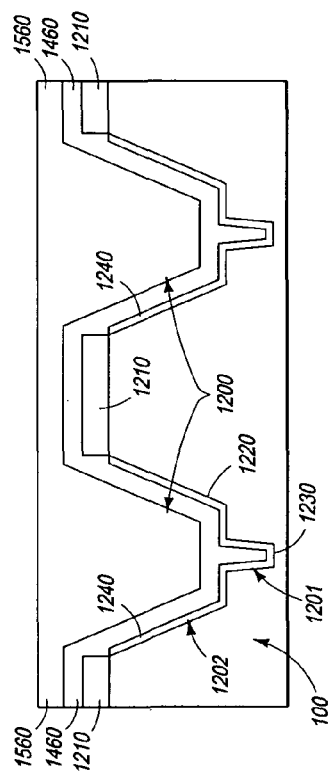
FIG. 15 shows a cross-sectional view of a semiconductor device at a fabrication stage subsequent to FIG. 14.
Figure 16:
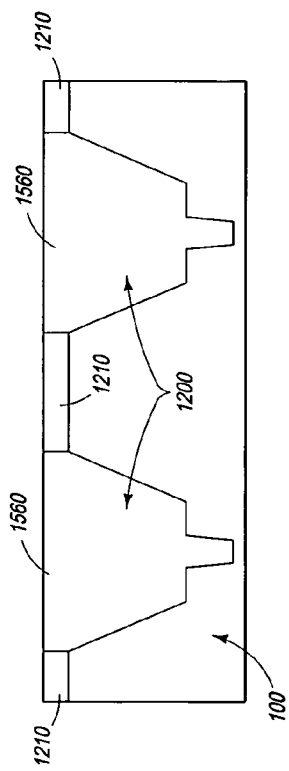
FIG. 16 shows a cross-sectional view of a semiconductor device at a fabrication stage subsequent to FIG. 15.
Figure 17:
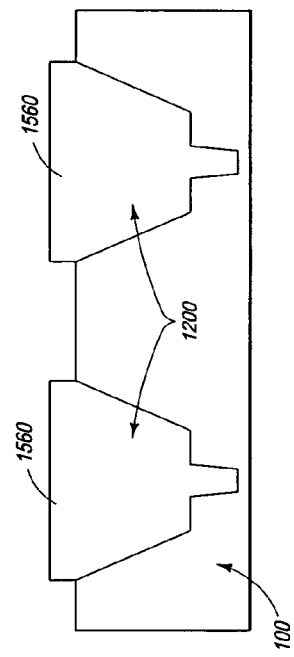
FIG. 17 shows a cross-sectional view of a semiconductor device at a fabrication stage subsequent to FIG. 16.

Referring to FIG. 15, the remainder of trench portion 1202 is filled using the standard high density plasma technique. Referring to FIG. 16, the trenches 1200 are planarized to the surface of the nitride layer 1210. This can be done by chemical mechanical polishing or by any other method known in the art. The nitride layer 1210 is then removed by an etching process, as shown in FIG. 17. It should be appreciated that any etching method known in the art can be used.

The illustrated second embodiment of the invention solves the prior art void and seam formation problems associated with filling goal-post shaped trenches with a high quality dielectric material. As discussed above, polysilicon is very conformal and does not form voids when deposited and silicon dioxide is known to be a good material for electrical isolation. The illustrated embodiments provide void free isolation regions.

The second embodiment has been described with reference to using one layer of deposited polysilicon 1450 which is oxidized to form oxide layer 1460. If desired, additional layers of polysilicon can be deposited over oxide layer 1460 and oxidized before the trench is filled using high density plasma to deposit an oxide. Additionally, layers of polysilicon can be deposited and oxidized until the trench is completely filled.

Figure 18:
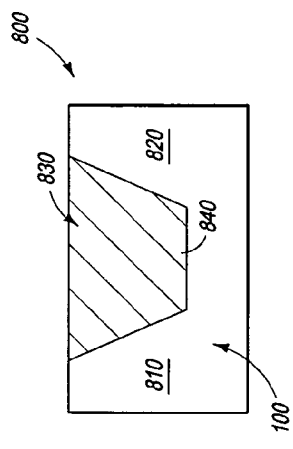
FIG. 18 shows a cross-sectional view of a portion of a memory cell according to another exemplary embodiment of the invention.
Figure 19:
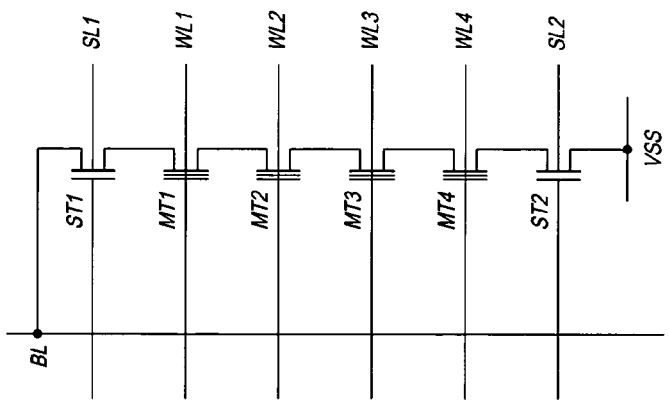
FIG. 19 is a view of the structure of a memory array in a conventional NAND type flash memory.

The trench isolation regions formed by the embodiments of the present invention may be used to separate active regions of an integrated circuit, for example, adjacent memory cell regions 810 and 820 of a flash memory array 800, which is partially shown in FIG. 18. The trench isolation region 830, comprised of silicon dioxide 840 (formed as described above), is between a first active region 810 and a second active region 820 respectively associated with memory cells of the flash memory array 800. For example, FIG. 19, depicts a NAND type flash memory comprising four memory cells MT1, MT2, MT3, and MT4 connected to one NAND string connected to one bit line BL. The trench isolation region 830 of FIG. 18, may be formed amongst any of the memory cells MT1, MT2, MT3, and MT4 to electrically isolate the memory cells from each other. The flash memory cells formed in regions 810 and 820 may be of any conventional construction. However, the invention is not limited to flash memory and can be used in any integrated circuit device where isolation is required.

Figure 20:
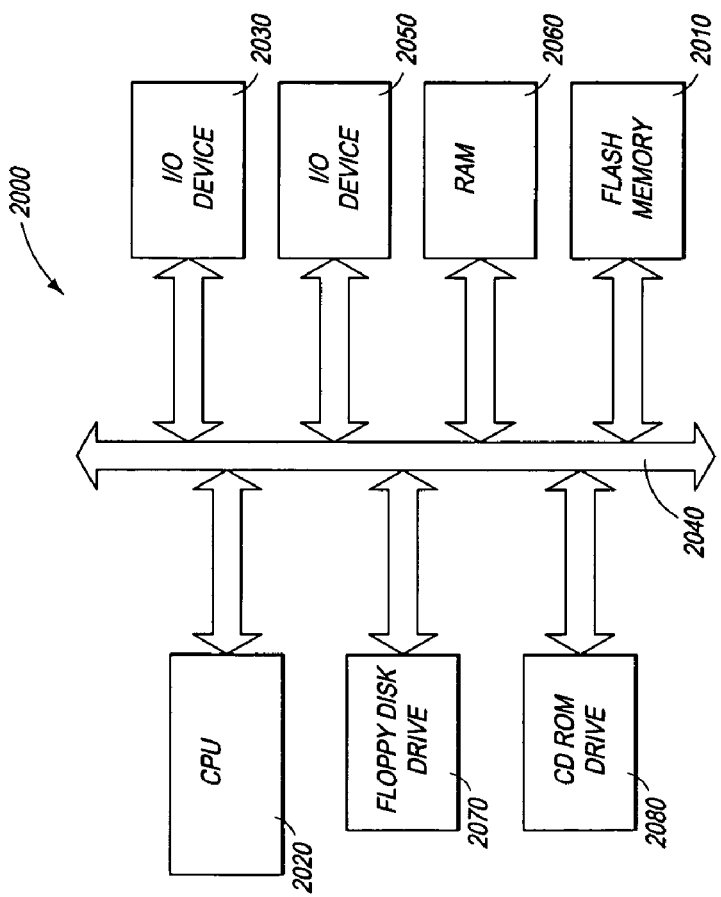
FIG. 20 shows a processor system incorporating a memory cell device with shallow trench isolation regions constructed in accordance with the exemplary embodiment of the invention.

FIG. 20 is a block diagram of a processor system 2000 utilizing a memory device 2010, e.g., a flash memory device, constructed in accordance with the present invention. That is, the memory device 2010 has cells separated by trench isolation regions constructed in accordance with the invention. The processor system 2000 may be a computer system, a process control system or any other system employing a processor and associated memory. The system 2000 includes a central processing unit (CPU) 2020, e.g., a microprocessor, that communicates with the flash memory 2010 and an I/O device 2030 over a bus 2040. It must be noted that the bus 2040 may be a series of buses and bridges commonly used in a processor system, but for convenience purposes only, the bus 2040 has been illustrated as a single bus. A second I/O device 2050 is illustrated, but is not necessary to practice the invention. The processor system 2000 also includes random access memory (RAM) device 2060 and may include a read-only memory (ROM) device (not shown), and peripheral devices such as a floppy disk drive 2070 and a compact disk (CD) ROM drive 2080 that also communicate with the CPU 2020 over the bus 2040 as is well known in the art.

The processes and devices described above illustrate preferred methods and typical devices of many that could be used and produced. The above description and drawings illustrate embodiments, which achieve the objects, features and advantages of the present invention. However, it is intended that the present invention be strictly limited to the above-described and illustrated embodiments. Any modification, though presently unforeseeable, of the present invention that comes within the spirit and scope of the following claims should be considered part of the present invention.

The invention claimed is:

1. A method of forming a trench isolation region comprising:
    forming a trench in a substrate;
    forming a thin thermal oxide layer on the sidewalls and bottom of said trench;
    depositing a polysilicon layer in direct physical contact with said thin thermal oxide layer on the sidewalls and bottom of said trench;
    oxidizing said polysilicon layer to form a first silicon dioxide layer, wherein the silicon dioxide layer is continuous between the sidewalls of said trench;
    repeating the steps of depositing the polysilicon layer and oxidizing the polysilicon layer to form a second silicon dioxide layer in direct contact with the first silicon dioxide layer; and
    filling the remainder of the trench with an insulator, the insulator formed above and in direct contact with the second silicon dioxide layer.

2. The method of claim 1, wherein said insulator is formed by repeating the steps of depositing the polysilicon layer and oxidizing the polysilicon layer until the trench is filled.

3. The method of claim 1, wherein said insulator is formed by filling the trench with high density plasma oxide.

4. The method of claim 3, wherein before said insulator is formed, a second polysilicon layer is deposited over said silicon dioxide layer to form a second silicon dioxide layer and then said insulator is formed by filling the trench with high density plasma oxide.

5. The method of claim 1, wherein said trench comprises a first upper trench portion and a second lower trench portion being below the upper trench portion, wherein the lower trench portion has a width less than the width of the upper trench portion and wherein the upper trench portion has a lower surface in a horizontal direction, the lower surface being above a lower surface of the lower trench portion.

6. A method of forming a trench isolation region comprising:
   forming a trench in a substrate;
   forming a thin thermal oxide layer on sidewalls of the trench;
   forming a first polysilicon layer in direct physical contact with said thin thermal oxide layer on the sidewalls and bottom of said trench;
   oxidizing said first polysilicon layer to form a first silicon oxide layer, wherein the first silicon oxide layer is continuous between the sidewalls of said trench;
   forming a second polysilicon layer above and in direct physical contact with said first oxidized silicon oxide layer; and
   oxidizing said second polysilicon layer to form a second silicon oxide layer.

7. The method of claim 6, further comprising:
   forming a third polysilicon layer above said second oxide layer; and
   oxidizing said third polysilicon layer to form a third silicon oxide layer.

8. The method of claim 6, wherein the oxide layer is formed by deposition.

9. The method of claim 6, wherein the oxide layer is formed by oxidation.

10. The method of claim 6, further comprising the step of filling the remainder of the trench using high density plasma deposition.

11. The method of claim 10, further comprising the step of filling the remainder of the trench using high density plasma chemical vapor deposition.

12. The method of claim 6, further comprising planarizing the trench isolation region using chemical mechanical polishing after the final oxidizing step.

13. The method of claim 6, wherein said trench comprises a first upper trench portion and a second lower trench portion being below the upper trench portion, wherein the lower trench portion has a width less than the width of the upper trench portion and wherein the upper trench portion has a lower surface in a horizontal direction, the lower surface being above a lower surface of the lower trench portion.

* * * * *